(12) United States Patent
Nath et al.

(10) Patent No.: US 12,507,486 B2
(45) Date of Patent: Dec. 23, 2025

(54) VERTICALLY INTEGRATED SCR STRUCTURE WITH SOI-BASED RAISED TRIGGER ELEMENT

(71) Applicant: GlobalFoundries U.S. Inc., Malta, NY (US)

(72) Inventors: Anindya Nath, Essex Junction, VT (US); Alain F. Loiseau, Williston, VT (US); Souvick Mitra, Essex Junction, VT (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 493 days.

(21) Appl. No.: 17/945,348

(22) Filed: Sep. 15, 2022

(65) Prior Publication Data

US 2024/0096874 A1 Mar. 21, 2024

(51) Int. Cl.
*H10D 89/60* (2025.01)

(52) U.S. Cl.
CPC ................ *H10D 89/713* (2025.01)

(58) Field of Classification Search
USPC ......................................... 257/173
See application file for complete search history.

(56) References Cited

U.S. PATENT DOCUMENTS

| | | |
|---|---|---|
| 5,719,411 A | 2/1998 | Ajit |
| 5,923,067 A | 7/1999 | Voldman |
| 6,268,992 B1 | 7/2001 | Lee et al. |
| 6,338,986 B1 | 1/2002 | Kawazoe et al. |
| 6,768,619 B2 | 7/2004 | Ker et al. |
| 6,815,732 B1 | 11/2004 | Vashchenko et al. |
| 6,919,588 B1 | 7/2005 | Vashchenko et al. |
| 6,933,573 B2 | 8/2005 | Ker et al. |
| 7,471,493 B1 | 12/2008 | Huang et al. |
| 7,609,493 B1 | 10/2009 | Salman et al. |
| 8,134,211 B2 | 3/2012 | Manna et al. |
| 8,399,921 B2 | 3/2013 | Tu |
| 9,461,032 B1 | 10/2016 | Edwards |
| 9,847,408 B1 | 12/2017 | Jain et al. |
| 10,008,491 B1 | 6/2018 | Li et al. |
| 11,335,674 B2 | 5/2022 | Mitra et al. |
| 2002/0064007 A1 | 5/2002 | Chang et al. |
| 2003/0213971 A1 | 11/2003 | Yu |

(Continued)

FOREIGN PATENT DOCUMENTS

| | | |
|---|---|---|
| CN | 204792791 | 11/2015 |
| EP | 2395620 | 12/2011 |

OTHER PUBLICATIONS

Philippe Galy et al., "Ultracompact ESD Protection With BI MOS-Merged Dual Back-to-Back SCR in Hybrid Bulk 28-nm FD-SOI Advanced CMOS Technology", IEEE Transactions on Electron Devices, vol. 64, No. 10, Oct. 2017, 8 pages.

(Continued)

*Primary Examiner* — Duy T Nguyen
*Assistant Examiner* — Jiyoung Oh
(74) *Attorney, Agent, or Firm* — Francois Pagette; Andrew M. Calderon; Calderon Safran & Wright P.C.

(57) ABSTRACT

The present disclosure relates to a structure including a trigger element within a semiconductor-on-insulator (SOI) substrate, and a silicon controlled rectifier (SCR) under a buried insulator layer of the SOI substrate. The trigger element is between an anode and a cathode of the SCR.

19 Claims, 9 Drawing Sheets

(56) References Cited

U.S. PATENT DOCUMENTS

| | | |
|---|---|---|
| 2004/0051147 A1 | 3/2004 | Panday et al. |
| 2004/0110353 A1 | 6/2004 | Mallikarjunaswamy |
| 2006/0231893 A1 | 10/2006 | Bernstein et al. |
| 2007/0267700 A1 | 11/2007 | Russ et al. |
| 2008/0048215 A1 | 2/2008 | Davies |
| 2009/0152587 A1 | 6/2009 | Cerati et al. |
| 2010/0271851 A1 | 10/2010 | Ankoudinov et al. |
| 2013/0075854 A1 | 3/2013 | Chang et al. |
| 2013/0242448 A1 | 9/2013 | Salcedo et al. |
| 2014/0015002 A1* | 1/2014 | Fonteneau ........... H10D 89/713 257/133 |
| 2014/0015052 A1* | 1/2014 | Fenouillet-Beranger .................... H10D 87/00 257/348 |
| 2014/0131710 A1 | 5/2014 | Chung |
| 2014/0138735 A1 | 5/2014 | Clarke et al. |
| 2015/0023105 A1 | 1/2015 | Widjaja et al. |
| 2015/0060939 A1 | 3/2015 | Di Sarro et al. |
| 2015/0236011 A1 | 8/2015 | Wang et al. |
| 2016/0173083 A1 | 6/2016 | Alexander |
| 2016/0225755 A1 | 8/2016 | Wang |
| 2017/0062406 A1 | 3/2017 | Ko et al. |
| 2017/0141097 A1 | 5/2017 | Bobde et al. |
| 2017/0194504 A1* | 7/2017 | Purakh ................. H10D 86/01 |
| 2017/0256535 A1 | 9/2017 | Nandakumar et al. |
| 2017/0287894 A1 | 10/2017 | Kuo et al. |
| 2017/0323882 A1 | 11/2017 | Langguth et al. |
| 2019/0181134 A1 | 6/2019 | Salman et al. |
| 2019/0319454 A1 | 10/2019 | Sithanandam et al. |
| 2020/0083212 A1 | 3/2020 | Zhao et al. |
| 2020/0357788 A1 | 11/2020 | De Conti et al. |
| 2020/0365716 A1 | 11/2020 | Chen |
| 2020/0411504 A1 | 12/2020 | Mitra et al. |
| 2021/0091236 A1* | 3/2021 | Liu .................... H10D 30/0323 |
| 2021/0280699 A1 | 9/2021 | Nath et al. |

OTHER PUBLICATIONS

Dray et al., "ESD design challenges in 28nm hybrid FDSOI/Bulk advanced CMOS process", IEEE, Oct. 18, 2012, 7 pages.
European Search Report and Opinion dated Feb. 6, 2024 in EP Application No. 23188284.6-1020, 8 pages.
Korean Notice of Preliminary Rejection dated Feb. 24, 2025 in KR Application No. 10-2023-0106651, with Google English Translation, 12 pages.
Taiwanese Office Action in TW Application No. 112130573 dated Feb. 24, 2025, with Google English Translation, 12 pages.

* cited by examiner

US 12,507,486 B2

VERTICALLY INTEGRATED SCR STRUCTURE WITH SOI-BASED RAISED TRIGGER ELEMENT

BACKGROUND

The present disclosure relates to semiconductor structures and, more particularly, to a trigger silicon controlled rectifier (SCR) circuit in a bulk region of a semiconductor on insulator (SOI) material and methods of manufacture and operation.

A silicon controlled rectifier (SCR) or semiconductor controlled rectifier is a four-layer solid-state current-controlling device. SCRs are unidirectional devices (i.e., can conduct current only in one direction) and are triggered normally by a positive current going into the gate structure. SCRs are mainly used in devices where the control of high power, possibly coupled with high voltage, is required, e.g., as power regulators and motor controls.

Similarly, a diode is an electrical component that allows the flow of current in only one direction. Typically, a large radio-frequency (RF) swing causes junction breakdown, poor voltage scaling, and harmonics distortion in bulk string diodes when used as electrostatic discharge (ESD) protection for RF-switches. Also, relying on the switch self-protection often time results in lower ESD protection levels than desired. Further, known circuits may include trigger diodes built in semiconductor on insulator (SOI) and laterally connected with the SCR in the bulk region.

SUMMARY

In an aspect of the disclosure, a structure comprises: a trigger element within a semiconductor-on-insulator (SOI) substrate; and a silicon controlled rectifier (SCR) under a buried insulator layer of the SOI substrate. The trigger element is between an anode and a cathode of the SCR.

In an aspect of the disclosure, a circuit comprises: a silicon controlled rectifier (SCR) below a buried insulator layer; and a trigger element including a single crystalline semiconductor material above the buried insulator layer. A plurality of doped regions surround the single crystalline semiconductor material.

In an aspect of the disclosure, a method comprises: forming a trigger element within a silicon-on-insulator (SOI); and forming a silicon controlled rectifier (SCR) under a buried oxide (BOX) layer. The trigger element is between an anode and a cathode of the SCR.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a trigger silicon controlled rectifier (SCR) circuit in a bulk region or a semiconductor on insulator (SOI) material and methods of manufacture. In the present disclosure, a SCR is built in a substrate region (e.g., below a buried oxide (BOX) layer) and a single crystal semiconductor trigger element is built using the SOI and between an anode and cathode of the SCR. Advantageously, the trigger SCR circuit is area efficient (e.g., 20% smaller area) due to vertical integration, eliminates a trigger diode's Darlington effect, and does not need any extra mask or process changes in comparison to known circuits.

In more specific embodiments, the present disclosure prevents the Darlington effect by having a single crystalline trigger element in the SOI and on top of the SCR. In this way, the present disclosure prevents a Darlington effect in vertical pnp/npn devices which, in turn, prevents scaling behavior (e.g., due to higher leakage, high power dissipation due to high saturation voltage, lower switching speed, etc.) In embodiments, the trigger SCR circuit includes a vertically stacked diode-trigger SCR. Further, the trigger diodes are polysilicon (i.e., gate material) and are vertically stacked on the top of the SCR. In addition, an entirety of the trigger SCR circuit is built in bulk semiconductor material or in bulk semiconductor material on a trap-rich silicon layer.

The trigger silicon controlled rectifier (SCR) circuit of the present disclosure may be manufactured in several ways using a number of different tools. In general, though, the methodologies and tools are used to form structures with dimensions in the micrometer and nanometer scale. The methodologies, i.e., technologies, employed to manufacture the trigger silicon controlled rectifier (SCR) circuit of the present disclosure have been adopted from integrated circuit (IC) technology. For example, the structures are built on wafers and are realized in films of material patterned by photolithographic processes on the top of a wafer. In particular, the fabrication of the trigger silicon controlled rectifier (SCR) circuit uses three basic building blocks: (i) deposition of thin films of material on a substrate, (ii) applying a patterned mask on top of the films by photolithographic imaging, and (iii) etching the films selectively to the mask.

Figure 1A:
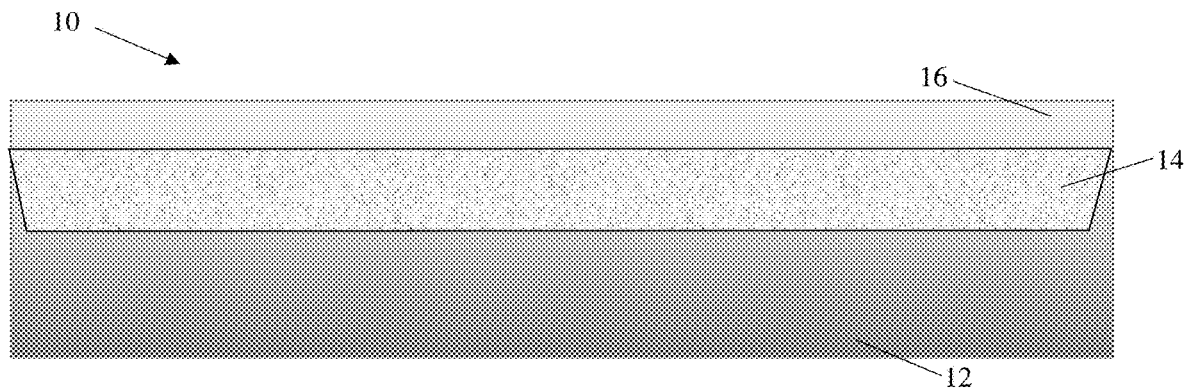
FIGS. 1A-1F show structures of the trigger silicon controlled rectifier (SCR), amongst other features, and respective fabrication processes in accordance with aspects of the present disclosure.

FIGS. 1A-1F show structures of the trigger silicon controlled rectifier (SCR), amongst other features, and respective fabrication processes in accordance with aspects of the present disclosure. In FIG. 1A, a structure 10 includes a handle substrate 12, a buried insulator layer 14, e.g., buried oxide (BOX), on the handle substrate 12, and a semiconductor layer 16 on the insulator layer 14. The handle substrate 12 and semiconductor layer 16 may be composed of any suitable semiconductor material including, but not limited to, Si, SiGe, SiGeC, SiC, GaAs, InAs, InP, and other III/V or II/VI compound semiconductors. In embodiments, the semiconductor layer 16 may be a single crystalline layer of Si.

Figure 1B:
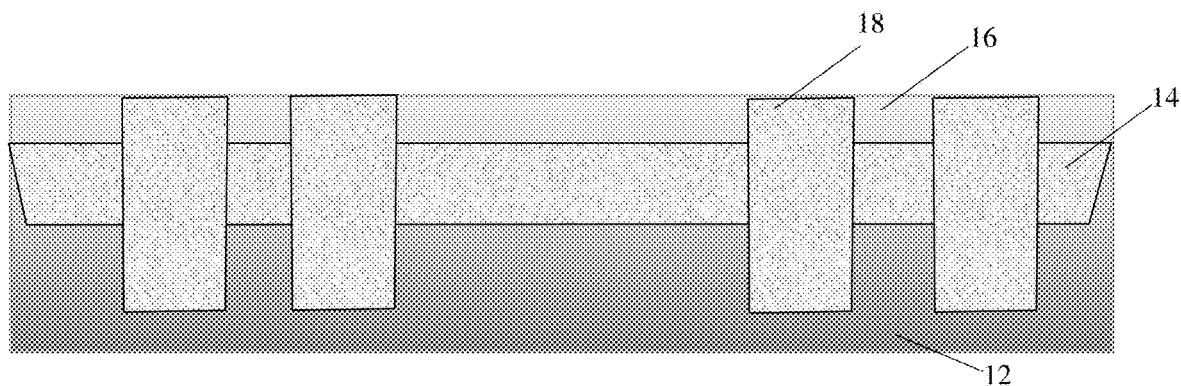

In FIG. 1B, shallow trench isolation (STI) structures 18 may be formed in the handle substrate 12, the insulator layer 14, and the semiconductor layer 16 using conventional lithography, etching and deposition methods known to those of skill in the art. For example, a resist formed over the semiconductor layer 16 is exposed to energy (light) to form a pattern (opening). An etching process with a selective chemistry, e.g., reactive ion etching (RIE), will be used to transfer the pattern from the resist layer to form one or more trenches in the handle substrate 12, the insulator layer 14, and the semiconductor layer 16. Following removal of the resist layer using a conventional stripping method such as oxygen ashing, an insulating material, e.g., $SiO_2$, may be deposited within the trenches using conventional deposition methods, e.g., CVD. A planarization process, e.g., chemical mechanical planarization (CMP) may be used to remove any of residual material on the semiconductor layer 16.

Figure 1C:
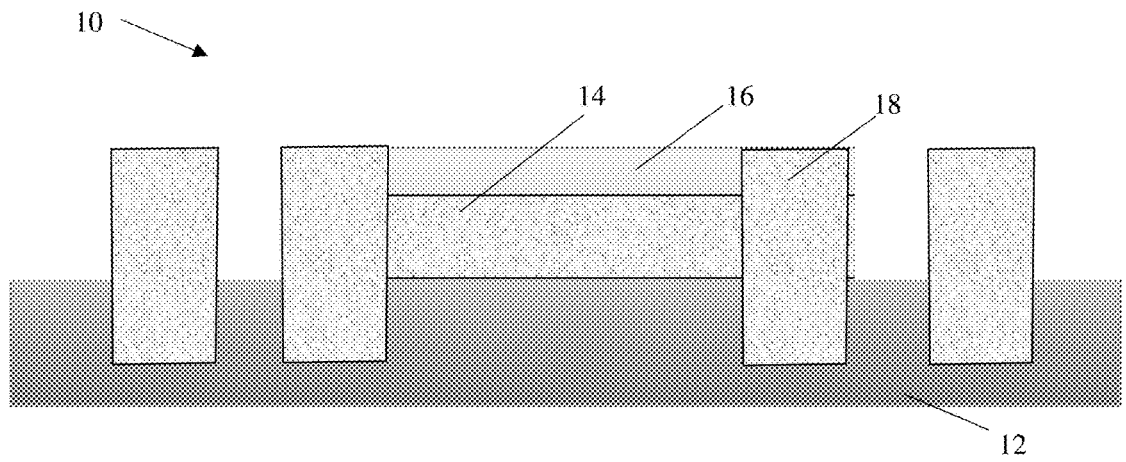

In FIG. 1C, an etching process may be used to remove portions of the insulator layer 14 and the semiconductor layer 16 to expose portions of the handle substrate 12. In embodiments, the etching process includes a lithography process followed by a RIE process as is known in the art. In this embodiment, a resist or hardmask will protect part of the semiconductor layer 16 between the inner shallow trench isolation structures 18.

Figure 1D:
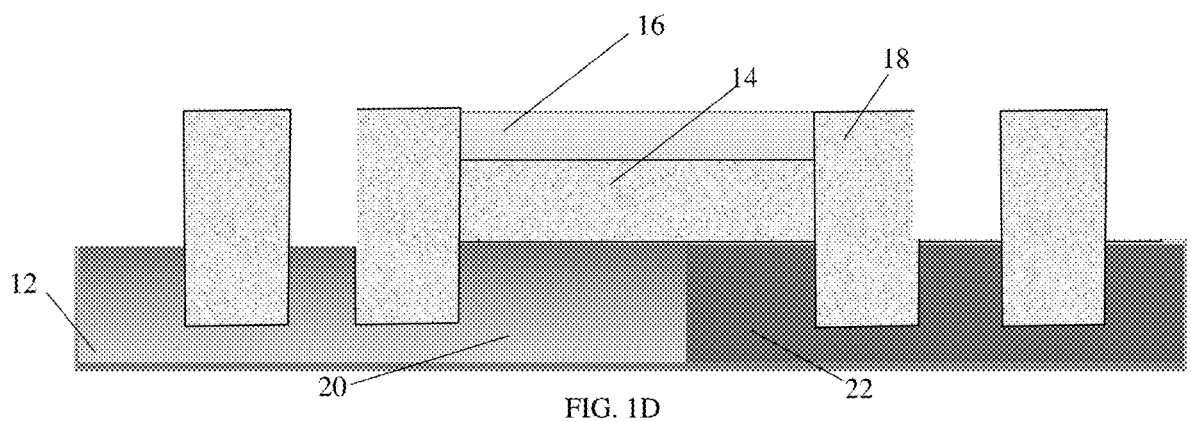

In FIG. 1D, an N-well 20 and a P-well 22 may be formed by conventional ion implantation processes. For example, the N-well 20 and the P-well 22 may be formed by introducing a concentration of different dopants of opposite conductivity type in the handle substrate 12. In embodiments, respective patterned implantation masks may be used to define selected areas exposed for the implantations. The implantation masks may include a layer of a light-sensitive material, such as an organic photoresist, applied by a spin coating process, pre-baked, exposed to light projected through a photomask, baked after exposure, and developed with a chemical developer. Each of the implantation masks has a thickness and stopping power sufficient to block masked areas against receiving a dose of the implanted ions. The P-well 22 may be doped with p-type dopants, e.g., Boron (B), and the N-well 20 may be doped with n-type dopants, e.g., Arsenic (As), Phosphorus (P) and Sb, among other suitable examples.

Figure 1E:
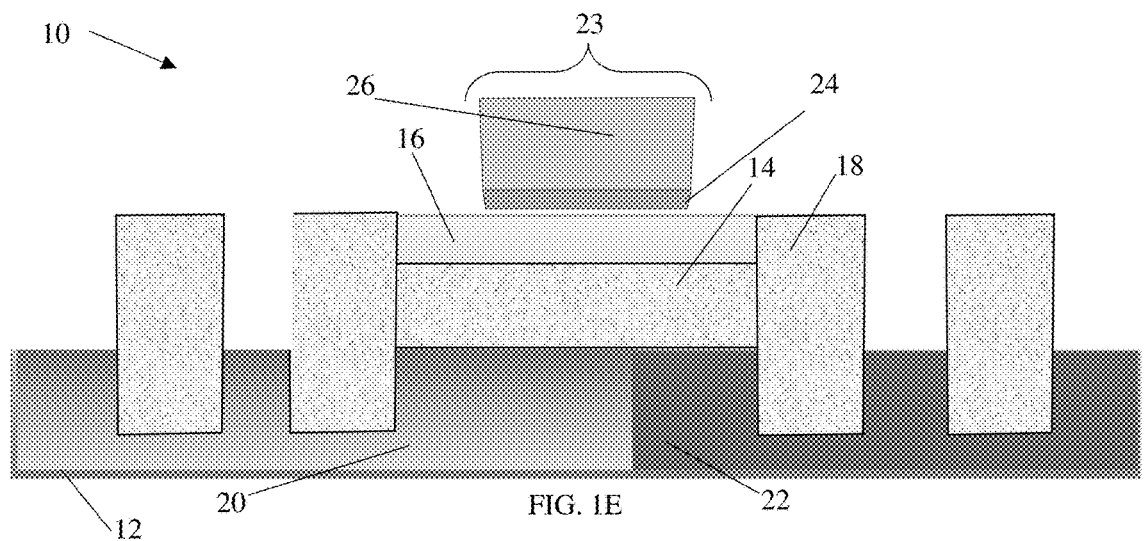

In FIG. 1E, a gate structure 23 may be formed on the semiconductor layer 16. For example, a gate dielectric material 24 (e.g., gate oxide) may be formed over the semiconductor layer 16 by a conventional deposition process, e.g., chemical vapor deposition (CVD) process or atomic layer deposition (ALD) or plasma enhanced CVD (PECVD). Further, a gate electrode material 26, e.g., polysilicon, may be formed over the gate dielectric material 24 by conventional deposition processes, e.g., CVD processes. A conventional patterning process may be used to pattern the materials 24, 26 into the gate structure 23 as is known in the art.

Figure 1F:
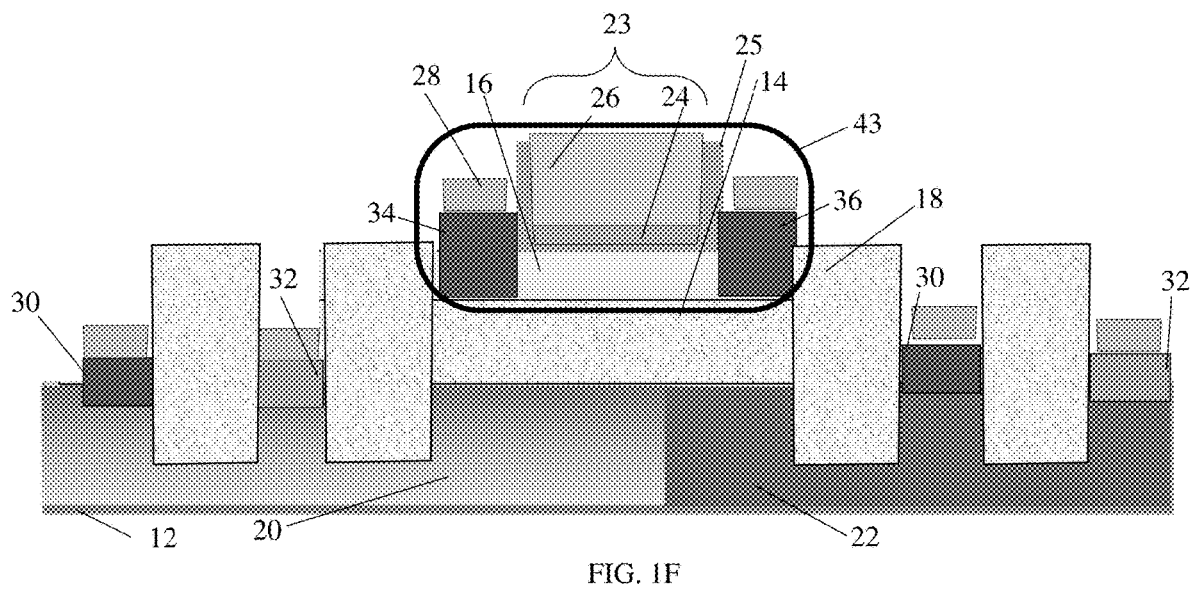

In FIG. 1F, sidewalls 25 may be formed on the sides of the gate structure 23. In embodiments, the sidewalls 25 may be formed by deposition of nitride and/or oxide, followed by a conventional anisotropic etching process after an epitaxial growth process or ion implantation process to form source regions 36 and drain regions 34 (e.g., N+ regions). The sidewall material may be used to prevent epitaxial growth on the gate structure 23 during the formation of the source regions 36 and drain regions 34 (and other raised regions, e.g., N+ regions 30 and P+ regions 32).

The N+ regions 30 and P+ regions 32, in addition to the source regions 36 and drain regions 34, may be formed by conventional epitaxial growth processes with an in-situ doping process to form raised doped regions, particularly raised source regions 36 and raised drain regions 34 adjacent to the gate structure 23. Alternatively, the source regions 36, drain regions 34, N+ regions 30 and P+ regions 32 may be formed by ion implantation processes. For example, the regions 30, 32, 34, 36 may be formed by introducing a concentration of different dopants of opposite conductivity type in the handle substrate 12. The P+ regions may include p-type dopants, e.g., Boron (B), and the N+ regions 30 may include n-type dopants, e.g., Arsenic (As), Phosphorus (P) and Sb, among other suitable examples. The insulator layer 14, semiconductor layer 16, gate dielectric material 24, gate dielectric material 26, N+ regions 30, drain region 34, and source region 36 may form a trigger element 43.

A silicide 28 can be formed on the patterned semiconductor materials. As should be understood by those of skill in the art, the silicide process begins with deposition of a thin transition metal layer, e.g., nickel, cobalt or titanium, over fully formed and patterned semiconductor devices (e.g., doped regions and gate structure 23). After deposition of the material, the structure is heated allowing the transition metal to react with exposed silicon (or other semiconductor material as described herein) in the active regions of the semiconductor device (e.g., source, drain, gate contact region) forming a low-resistance transition metal silicide 28. Following the reaction, any remaining transition metal is removed by chemical etching, leaving silicide contacts 28 in the active regions of the device.

Figure 2:
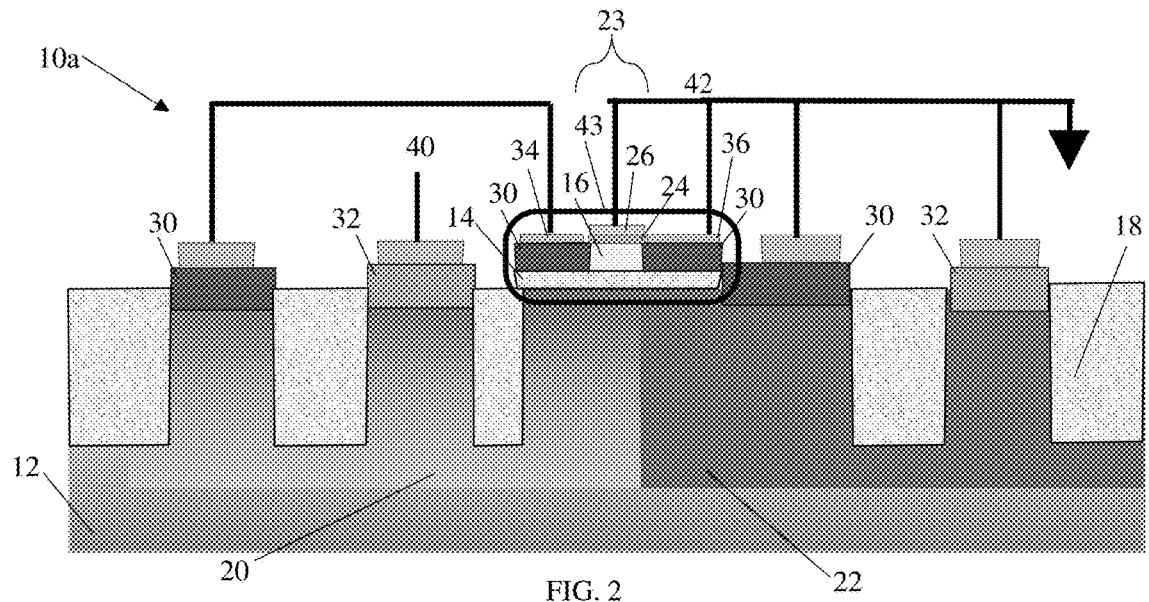
FIGS. 2-4 show a field effect transistor (FET) triggered SCR under a buried oxide (BOX) in accordance with aspects of the present disclosure.
Figure 3:
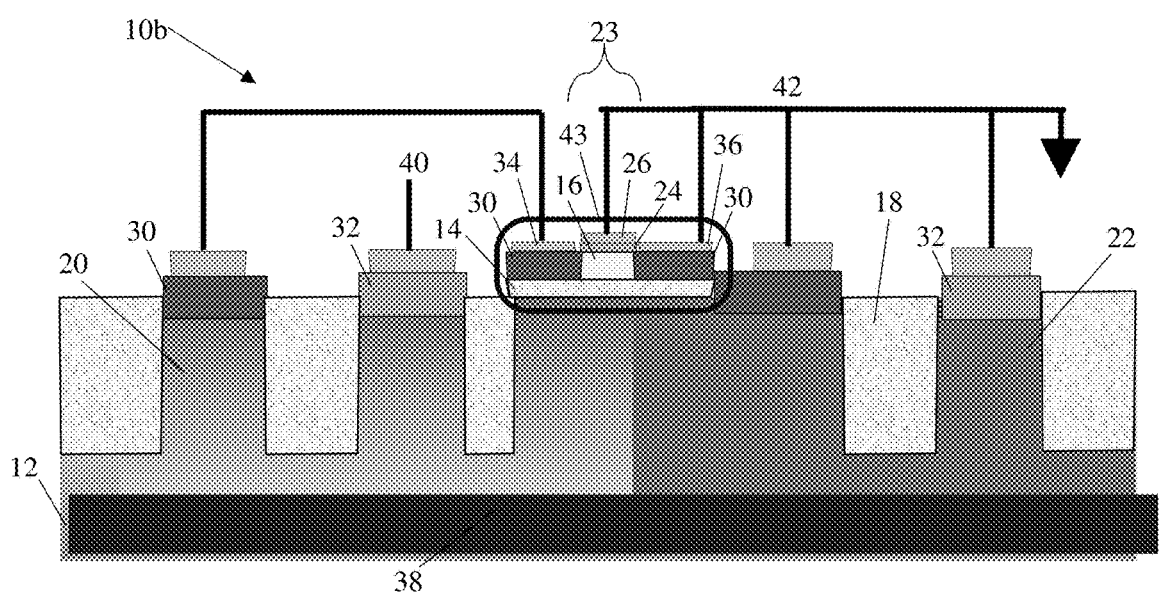
Figure 4:
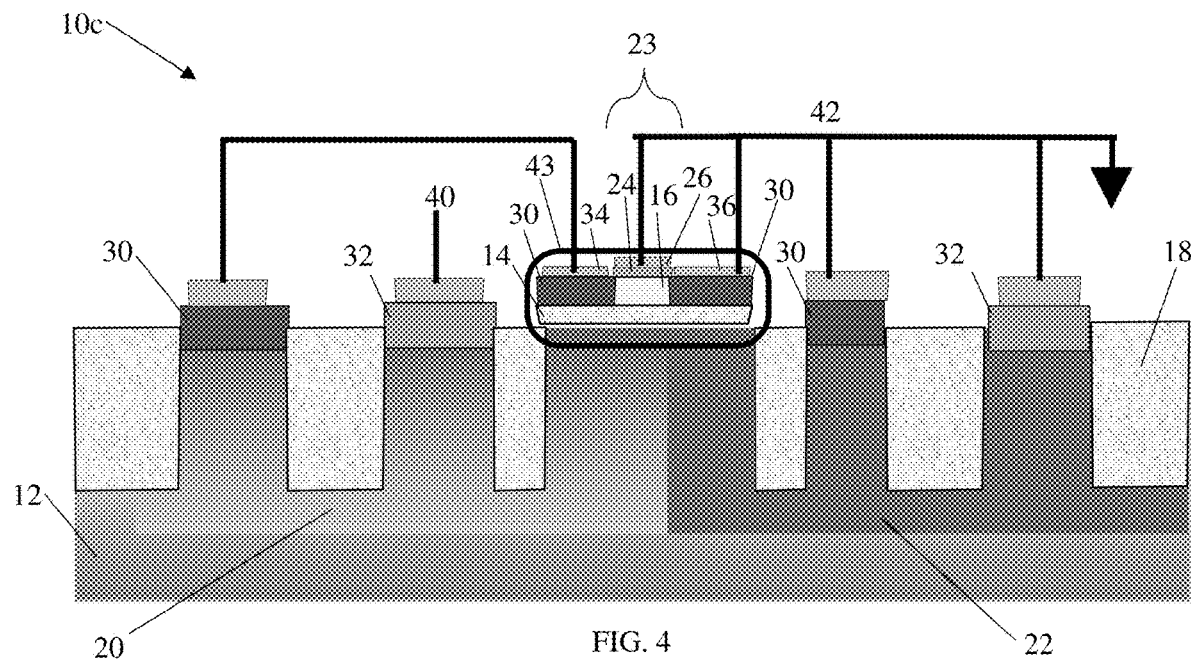

FIGS. 2-4 show field effect transistor (FET) triggered SCRs under a buried insulator layer in accordance with aspects of the present disclosure. In FIGS. 2-4, the FET triggered SCR may have a smaller area due to vertical integration and further is capable eliminating the Darlington effect due to the use of a trigger element 43.

The structure 10a of FIG. 2 includes an anode 40 connected to the P+ region 32 and cathode 42 connected to the gate material (e.g., gate electrode) 26, source region 36, N+ region 30, P+ region 32, and ground. A trigger element 43 (represented by a bounded circle) may include the insulator layer 14, semiconductor layer 16, gate dielectric material 24, gate material 26, two N+ regions 30, drain regions 34, and source regions 36. Furthermore, as shown in FIG. 2, the trigger element 43 may comprise a field effect transistor (FET) (i.e., gate structure 23) on top of the SOI 16, e.g., semiconductor layer 16, and between the anode 40 and cathode 42 of the SCR. Additionally, an N+ region 30 outside of the trigger element 43 is connected to an N+ region 30 inside the trigger element 43. In FIG. 2, the structure 10a has three STI structures 18 on the side of the N-well 20, and two STI structures 18 on the side of the P-well 22. The remaining features are similar to that shown in FIG. 1F.

FIG. 3 shows a structure 10b similar to the structure 10a in FIG. 2 with the addition of a high resistivity layer 38 formed by conventional ion implantation processes within the handle substrate 12. In embodiments, the high resistivity layer 38 may be under and connected to the N-well 20 and the P-well 22. In embodiments, the high resistively layer 38 of the structure 10b may help isolate the SCR from the handle substrate 12.

In FIG. 4, a structure 10c includes three STI structures 18 on both sides of the trigger element 43 (e.g., three STI structures 18 on the side of the N-well 20 and three STI structures 18 on the side of the P-well 22). Therefore, the structure 10a in FIG. 2 has a smaller area size in comparison to the structure 10c in FIG. 4. In a further embodiment, the structure 10c may include the high resistivity layer 38 (not shown in FIG. 4). The remaining features are similar to that shown in FIG. 3.

Figure 5:
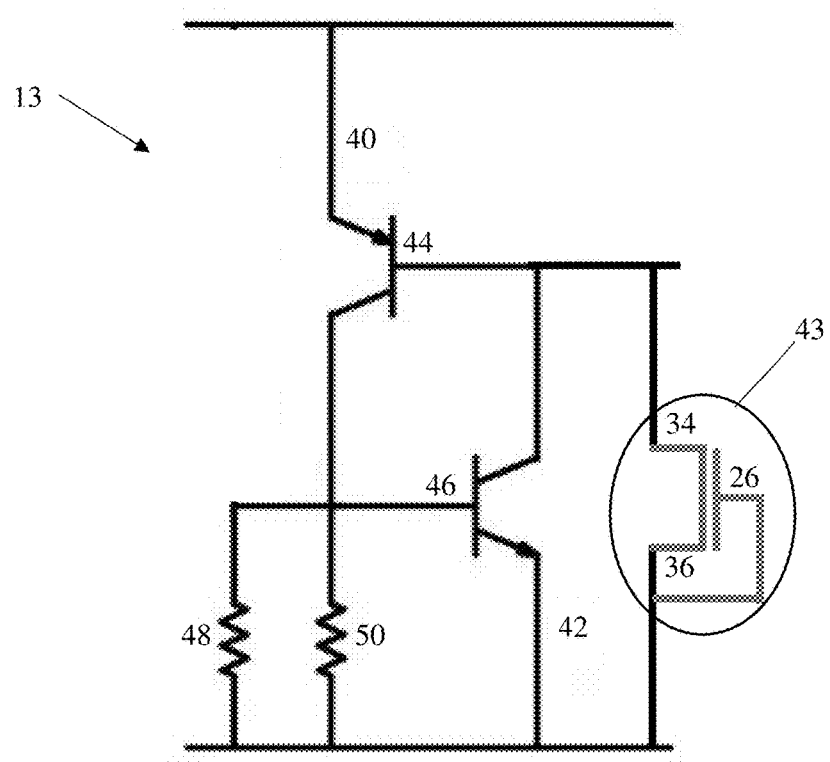
FIG. 5 shows a circuit schematic corresponding to the structures of FIGS. 2-4 in accordance with aspects of the present disclosure.

FIG. 5 shows a circuit schematic corresponding to the structures 10a, 10b, and 10c in FIGS. 2-4. In FIG. 5, a circuit schematic 13 includes the anode 40 connected to an emitter of a PNP bipolar junction transistor (BJT) 44. The emitter of a NPN BJT 46 is also connected to the cathode 42. The cathode 42 is connected to ground. The resistors 48 and 50 are representative of the P-well 22 and are connected to ground. The source region 36 of the trigger element 43 is connected to the gate material (e.g., electrode) 26 and ground. In embodiments, the trigger element 43 of FIG. 5 may be an NFET, although the use of a PFET is also contemplated. Further, the SCR may comprise the PNP BJT 44 and the NPN BJT 46.

Figure 6:
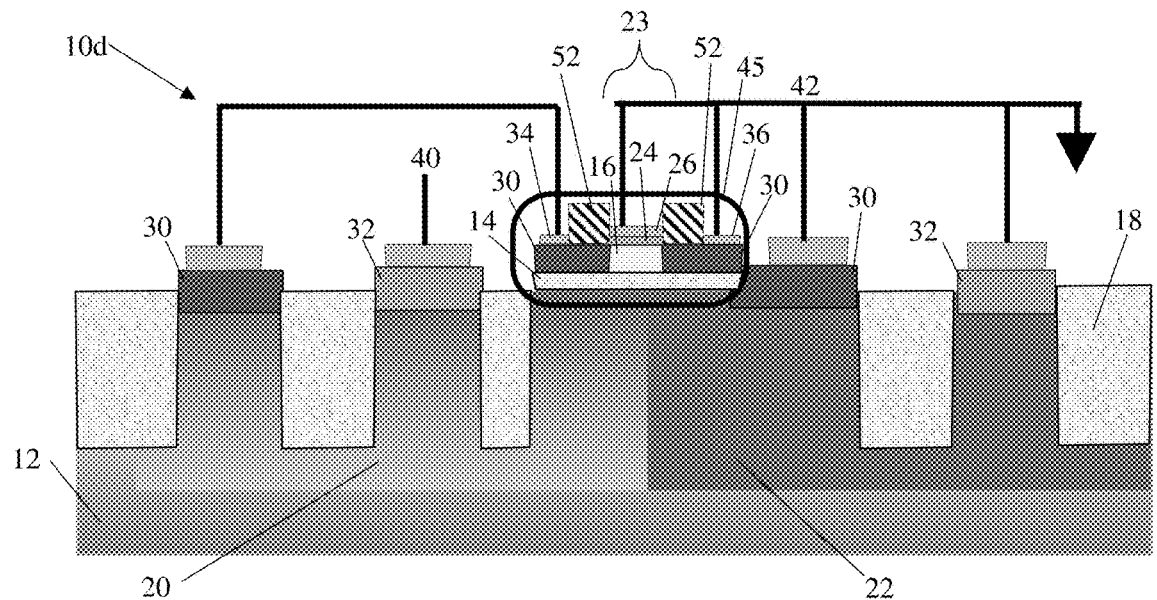
FIGS. 6-8 show a grounded gate (GG) electrostatic device NMOS (ESDNMOS) triggered SCR in accordance with additional aspects of the present disclosure.
Figure 7:
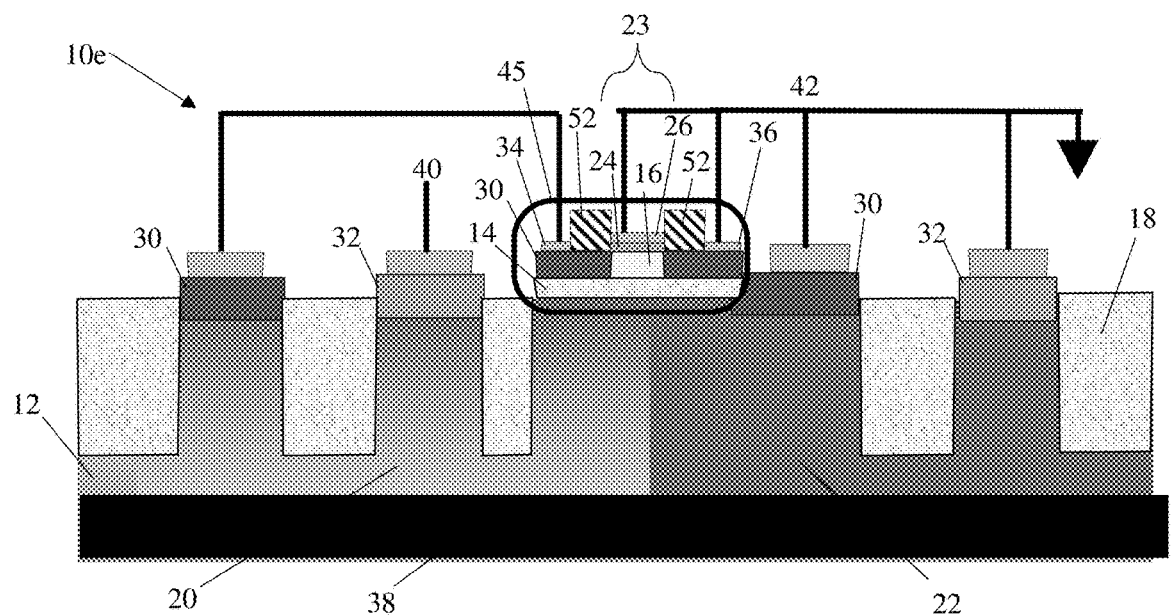
Figure 8:
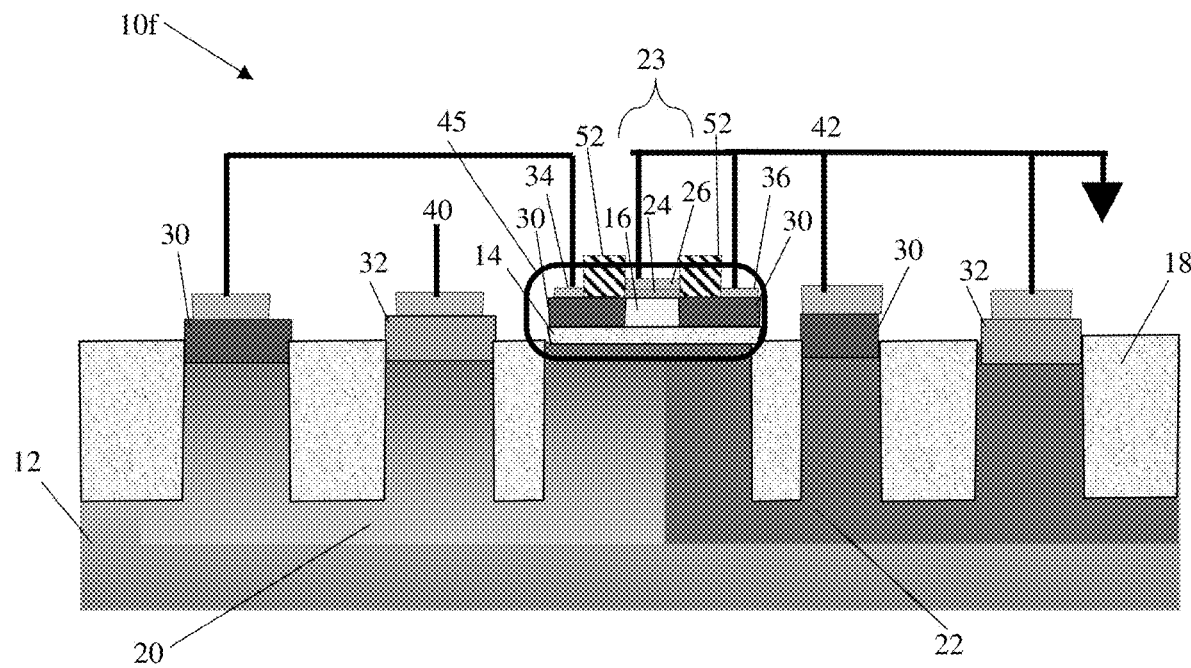

FIGS. 6-8 show a grounded gate (GG) electrostatic device NMOS (ESDNMOS) triggered SCRs. In FIGS. 6-8, the grounded gate (GG) electrostatic device NMOS (ESDN-MOS) triggered SCRs may have a smaller area due to vertical integration and also eliminates the Darlington effect due to the use of the trigger element 45.

In FIG. 6, the structure 10d includes a blocking layer 52 on the N+ region 30 and adjacent to the source regions 34 and the drain regions 36 within trigger element 45. The blocking layer 52 may cause portions of the source regions 34 and the drain regions 36 to be unsilicided. In embodiments, the blocking layer 52 may be a nitride or oxide layer which improves the electrical characteristics of the trigger element 45 by increasing an amount of discharge current. Therefore, although the trigger element 45 may have a larger area than the trigger element 43 of FIG. 2, the trigger element 45 may improve electrical characteristics by including the blocking layer 52 adjacent to the source regions 34 and drain regions 36. The structure 10d further includes three STI structures 18 on the side of the N-well 20, and two STI structures 18 on the side of the P-well 22 to decrease its size.

FIG. 7 shows a structure 10e similar to the structure 10d in FIG. 6. In FIG. 7, a high resistivity layer 38 formed by conventional ion implantation processes may be provided within the handle substrate 12, contacting the N-well 20 and the P-well 22. In embodiments, the high resistively layer 38 may help isolate the SCR from the handle substrate 12.

In FIG. 8, the structure 10f has three STI structures 18 on both the side of the N-well 20 and the side of the P-well 22. In further embodiments, the structure 10f in FIG. 8 does not include the high resistivity layer 38 within the handle substrate 12. The remaining features are similar to that shown in FIG. 6.

Figure 9:
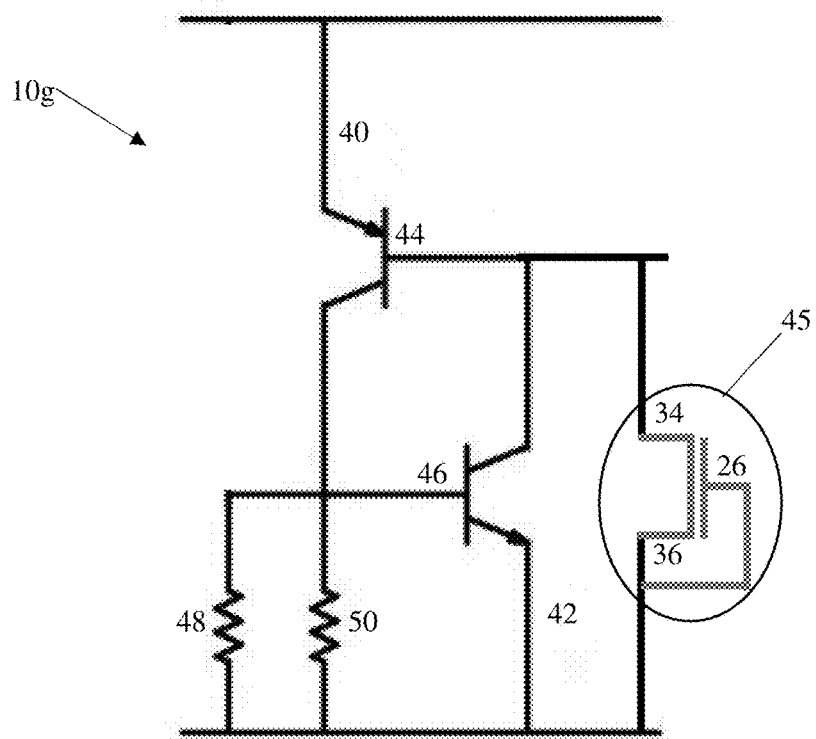
FIG. 9 shows a circuit schematic corresponding to the structures of FIGS. 6-8 in accordance with aspects of the present disclosure.

FIG. 9 shows a circuit schematic corresponding to the structures 10d 10e, and 10f in FIGS. 6-8. In FIG. 9, the circuit schematic 10g includes the anode 40 connected to an emitter of a PNP bipolar junction transistor (BJT) 44. Further, the emitter of a NPN BJT 46 is connected to the cathode 42. The cathode 42 is also connected to ground. The resistors 48 and 50 formed within the P-well 22 are also connected to ground. The trigger element 45 may be a field effect transistor (FET) with the source region 36 connected to the gate material (e.g., gate electrode) 26 and ground. The trigger element 45 of FIG. 9 may be an NFET, although a PFET is also contemplated herein. Further, in FIG. 9, the SCR may comprise the PNP BJT 44 and the NPN BJT 46.

Figure 10:
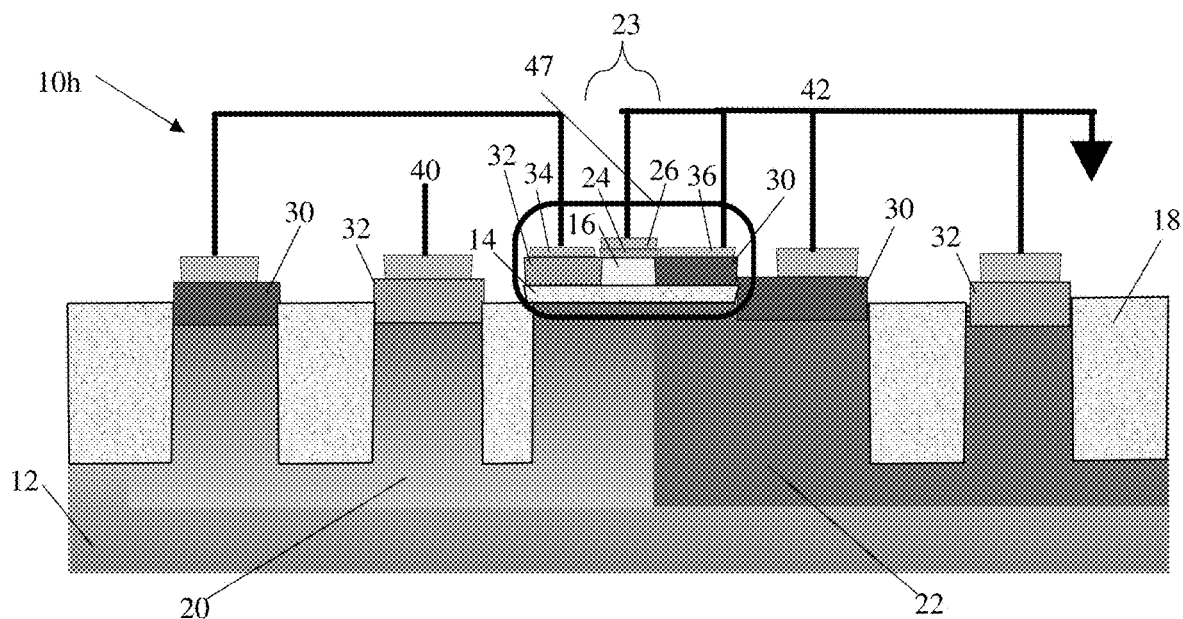
FIGS. 10-12 show a silicon on insulator (SOI) diode triggered SCR under the BOX in accordance with aspects of the present disclosure.
Figure 11:
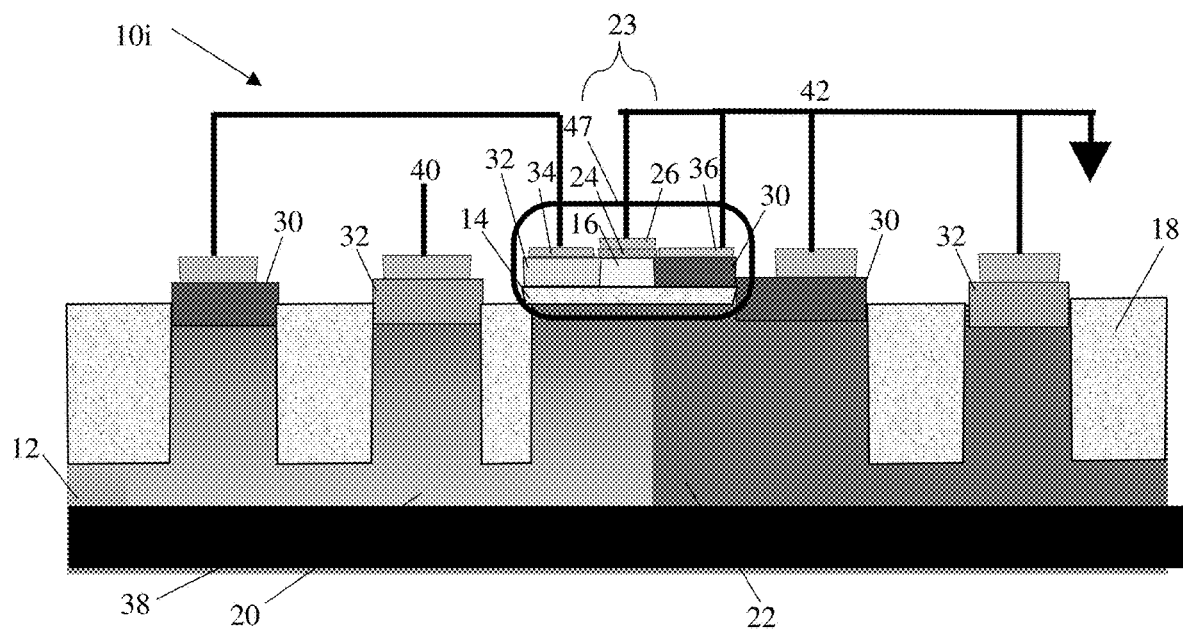
Figure 12:
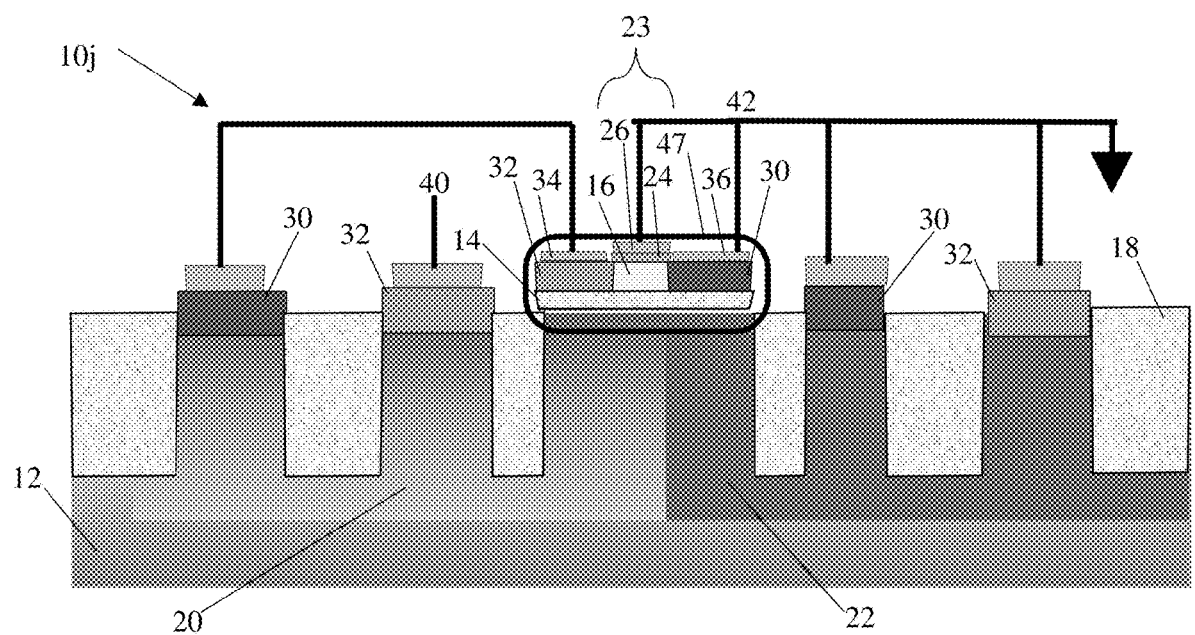

FIGS. 10-12 show a SOI diode triggered SCR under the buried insulator material in accordance with aspects of the present disclosure. In FIGS. 10-12, the silicon on insulator (SOI) diode triggered SCR under the buried insulator layer may have a smaller area due to vertical integration and also is capable of eliminating the Darlington effect due to the use of trigger element 47.

In FIG. 10, the trigger element 47 includes the N+ region 30 and the P+ region 32 in comparison to the trigger element 43 of FIG. 2 which includes only the N+ region 30. In embodiments, the trigger element 47 may comprise a diode on top of the SOI 16 (e.g., semiconductor layer 16) and between the anode 40 and cathode 42 of the SCR. In FIG. 10, the structure 10h has three STI structures 18 on the side of the N-well 20, and two STI structures 18 on the side of the P-well 22.

FIG. 11 shows another structure 10i similar to the structure 10h in FIG. 10. In FIG. 11, though, a high resistivity layer 38 may be formed by conventional ion implantation processes within the handle substrate 12 and in contact with the N-well 20 and the P-well 22. In embodiments, the high resistively layer 38 of the structure 10i may help isolate the SCR from the handle substrate 12.

In FIG. 12, the structure 10j includes three STI structures 18 on both sides of the trigger element 47 (e.g., three STI structures 18 on the side of the N-well 20 and three STI structures 18 on the side of the P-well 22). In further embodiments, the structure 10j may include a high resistivity layer 38 (not shown in FIG. 12) within the handle substrate 12.

Figure 13:
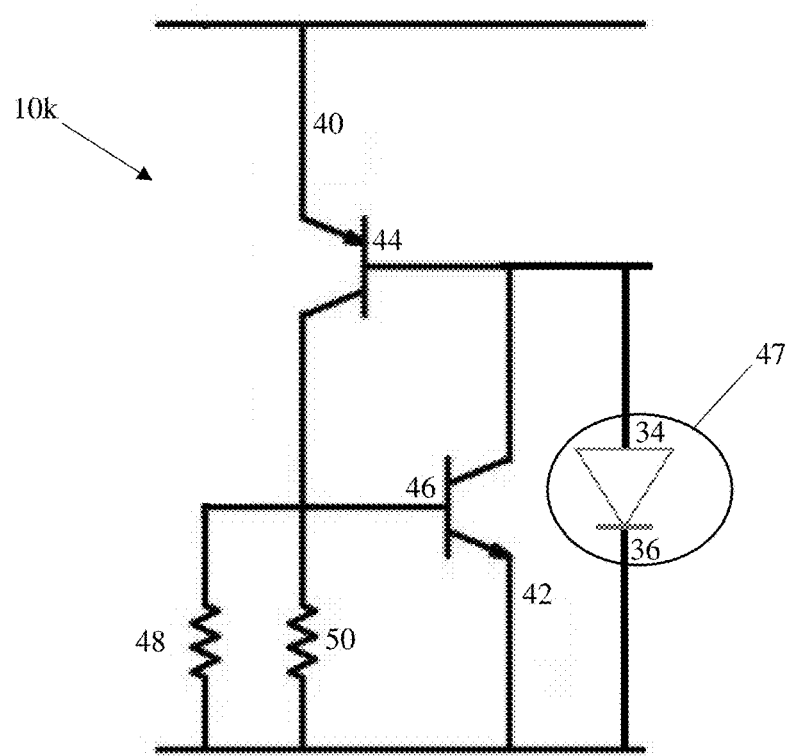
FIG. 13 shows a circuit schematic corresponding to the structures of FIGS. 10-12 in accordance with aspects of the present disclosure.

FIG. 13 shows a circuit schematic corresponding to the structures 10h, 10i, and 10j in FIGS. 10-12. In FIG. 13, a circuit schematic 10k includes the anode 40 connected to an emitter of a PNP bipolar junction transistor (BJT) 44. Further, an emitter of a NPN BJT 46 is connected to the cathode 42. The cathode 42 is also connected to ground in FIG. 13. The resistors 48 and 50 of the P-well 22 are also connected to ground. In FIG. 13, the trigger element 47 may be a diode which includes the drain regions 34, the gate material (e.g., gate electrode) 26, and the source regions 36. The source regions 36 are connected to ground. Further, in FIG. 13, the SCR of the present disclosure may comprise the PNP BJT 44 and the NPN BJT 46.

The trigger silicon controlled rectifier (SCR) circuit may be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips may be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either surface interconnections and buried interconnections or both surface interconnections and buried interconnections). In any case the chip is then integrated with other chips, discrete circuit elements, and/or other signal processing devices as part of either (a) an intermediate product, such as a motherboard, or (b) an end product. The end product may be any product that includes integrated circuit chips, ranging from toys and other low-end applications to advanced computer products having a display, a keyboard or other input device, and a central processor.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a trigger element within a semiconductor-on-insulator (SOI) substrate, the trigger element comprising a buried insulator layer of the SOI substrate, a semiconductor layer of the SOI substrate, the semiconductor layer of the SOI substrate between a first raised N+ region and a second raised N+ region, the first and second raised N+ regions being at a first level, a raised drain region above the first raised N+ region, a raised source region above the second raised N+ region, and a gate dielectric material above the semiconductor layer of the SOI substrate, the first raised N+ region and the second raised N+ region, and between the raised drain region and the raised source region, a third raised P+ region and a fourth raised P+ region on a second level being isolated from the first raised N+ and second raised N+ regions by a shallow trench isolation structure extending into the underlying SOI substrate below the buried insulator layer of the SOI substrate; and
   a silicon controlled rectifier (SCR) under the buried insulator layer of the SOI substrate, the trigger element being between an anode and a cathode of the SCR.

2. The structure of claim 1, wherein the anode is connected to a P+ region in an N-well below the buried insulator layer of the SOI substrate.

3. The structure of claim 1, wherein the cathode is connected to an N+ region in a P-well below the buried insulator layer of the SOI substrate.

4. The structure of claim 1, wherein the first raised N+ region comprises a first epitaxial raised N+ region under the raised drain region and raised the second N+ region comprises a second epitaxial raised N+ region under the raised source region, the first epitaxial raised N+ region is separated from the second epitaxial raised N+ region by the semiconductor layer of the SOI substrate, and the cathode is connected to the second epitaxial raised N+ region.

5. The structure of claim 4, wherein the SCR is on a trap-rich layer.

6. The structure of claim 4, wherein portions of the raised source region and the raised drain region are unsilicided.

7. The structure of claim 6, further comprising at least two STI structures on the side of a P-well below the buried insulator layer of the SOI substrate.

8. The structure of claim 6, wherein the raised source region and a gate electrode material are connected to an N+ region and a P+ region in a P-well below the buried insulator layer of the SOI substrate.

9. The structure of claim 1, further comprising three shallow trench isolation (STI) structures on a side of an N-well below the buried insulator layer of the SOI substrate.

10. The structure of claim 1, wherein the trigger element comprises an N+ region under the raised source region and a P+ region under the raised drain region, and the cathode is connected to the P+ region.

11. A circuit comprising:
    a silicon controlled rectifier (SCR) below a buried insulator layer; and
    a trigger element comprising a single crystalline semiconductor material above the buried insulator layer, and further comprising a plurality of raised doped regions surrounding the single crystalline semiconductor material, wherein the plurality of doped regions comprises raised N+ regions and raised P+ regions, the raised N+ regions sandwiching the single crystalline semiconductor material at a first level, and the raised P+ regions on a second level being isolated from the raised N+ regions by a shallow trench isolation structure extending into an underlying semiconductor substrate below the buried insulator layer.

12. The circuit of claim 11, wherein the trigger element is between an anode and a cathode of the SCR.

13. The circuit of claim 12, wherein the anode is connected to a P+ region in an N-well below the buried insulator layer.

14. The circuit of claim 12, wherein the cathode is connected to an N+ region in a P-well below the buried insulator layer.

15. The circuit of claim 12, wherein the raised N+ doped regions comprise at least two epitaxial raised N+ regions.

16. The circuit of claim 15, wherein a first raised epitaxial N+ region of the at least two raised epitaxial N+ regions is separated from a second raised epitaxial N+ region of the at least two raised epitaxial N+ regions by the single crystalline semiconductor material, and further comprising a raised drain region above the first raised epitaxial N+ region and a source region above the second raised epitaxial N+ region.

17. The circuit of claim 15, further comprising a blocking layer adjacent to a drain region and a source region of the trigger element.

18. The circuit of claim 11, wherein the trigger element comprises a gate electrode material, a raised drain region, and a raised source region, the raised source region and the raised drain region being above a raised epitaxial semiconductor layer comprising the raised doped regions.

19. A method comprising:
    forming a trigger element within a silicon-on-insulator (SOI) substrate, the trigger element comprising a buried insulator layer of the SOI substrate, a semiconductor layer of the SOI substrate, the semiconductor layer of the SOI substrate being between a first raised N+ region and a second raised N+ region, the first and second raised N+ regions being at a first level, a raised drain region above the first raised N+ region, a raised source region above the second raised N+ region, and a gate dielectric material above the semiconductor layer of the SOI substrate, the first raised N+ region and the second raised N+ region, and between the raised drain region and the raised source region; a third raised P+ region and a fourth raised P+ region on a second level being isolated from the first raised N+ and second raised N+ regions by a shallow trench isolation structure extending into the underlying SOI substrate below the buried insulator layer of the SOI substrate; and forming a silicon controlled rectifier (SCR) under the buried insulator layer of the SOI substrate, which is a buried oxide (BOX) layer, and wherein the trigger element is between an anode and a cathode of the SCR.

* * * * *